United States Patent [19]

Schutten et al.

[11] Patent Number: 4,622,568
[45] Date of Patent: * Nov. 11, 1986

[54] PLANAR FIELD-SHAPED BIDIRECTIONAL POWER FET

[75] Inventors: Herman P. Schutten, Milwaukee; James A. Benjamin, Waukesha, both of Wis.; Robert W. Lade, Fort Myers, Fla.

[73] Assignee: Eaton Corporation, Cleveland, Ohio

[ * ] Notice: The portion of the term of this patent subsequent to Nov. 12, 2002 has been disclaimed.

[21] Appl. No.: 608,402

[22] Filed: May 9, 1984

[51] Int. Cl.$^4$ .............................................. H01L 29/78
[52] U.S. Cl. .................................. 357/23.4; 357/23.8; 357/39; 357/52
[58] Field of Search .................. 357/23.4, 39, 52, 23.8

[56] References Cited

U.S. PATENT DOCUMENTS

| | | | |
|---|---|---|---|
| 4,199,774 | 4/1980 | Plummer | 357/23.4 |
| 4,292,642 | 9/1981 | Appels et al. | 357/52 |
| 4,300,150 | 11/1981 | Colak | 357/52 |
| 4,409,606 | 10/1983 | Wagenaar et al. | 357/52 |
| 4,498,094 | 2/1985 | Houthoff et al. | 357/23 R |

OTHER PUBLICATIONS

High Voltage Thin Layer Devices (Resurf Devices), J. A. Appels & H. M. J. Vaes, Philips Research Laboratories, Eindhoven—The Netherlands, International Electron Device Meeting Technical Digest, 1979, pp. 238-241 (CH1504-0/79/0000-0238$00.75).

Lateral DMOS Power Transistor Design, S. Colak, B. Singer, E. Stupp, IEE Electron Device Letters, vol. EDL-1, No. 4, Apr. 1980, pp. 51-53 (0193-8576/80/04-00-0051$00.75).

G. Feth et al., "Planar Trial Structures," IBM Tech Discl. Bull., vol. 19 #6, Nov. 1976, pp. 2297-2301.

Primary Examiner—Joseph E. Clawson, Jr.
Attorney, Agent, or Firm—Andrus, Sceales, Starke & Sawall

[57] ABSTRACT

Lateral planar FET structure (2) is disclosed for bidirection power switching, including AC application. Voltage blocking capability is enhanced in the lateral current flow device (2) by field shaping in the drift region (22). In the OFF state, the field shaping region (24) straightens field lines and prevents gradient induced depletion and unwanted inversion of conductivity type along a lateral drift region portion (54) extending beneath a top major surface (28) of the substrate between channel-containing regions (6) and (8).

19 Claims, 1 Drawing Figure

PLANAR FIELD-SHAPED BIDIRECTIONAL POWER FET

BACKGROUND AND SUMMARY

The invention provides planar lateral FET structure for bidirectional power switching, including AC application. The invention particularly provides enhanced OFF state voltage blocking capability in a planar device by means of field shaping in the drift region to straighten out field lines and prevent curvature crowding in the drift region portion between the channels. This prevents gradient induced depletion and unwanted inversion of conductivity type along the drift region portion between the channels during the OFF state. As a result, for a given ON state resistance specification, a greater blocking voltage can be obtained; or conversely, for a fixed OFF state blocking voltage requirement, a lower ON state resistance can be obtained.

Copending Application Ser. No. 390,562, filed June 21, 1982 discloses planar lateral AC power FET integrated structure. Copending Application Ser. No. 421,931, filed Sept. 23, 1982 discloses nonplanar AC power FET structure with current flow along the sides of a vertical notch, with a field shaping region forming a junction with the drift region opposite the channel-containing region junctions.

DETAILED DESCRIPTION

Figure 1:
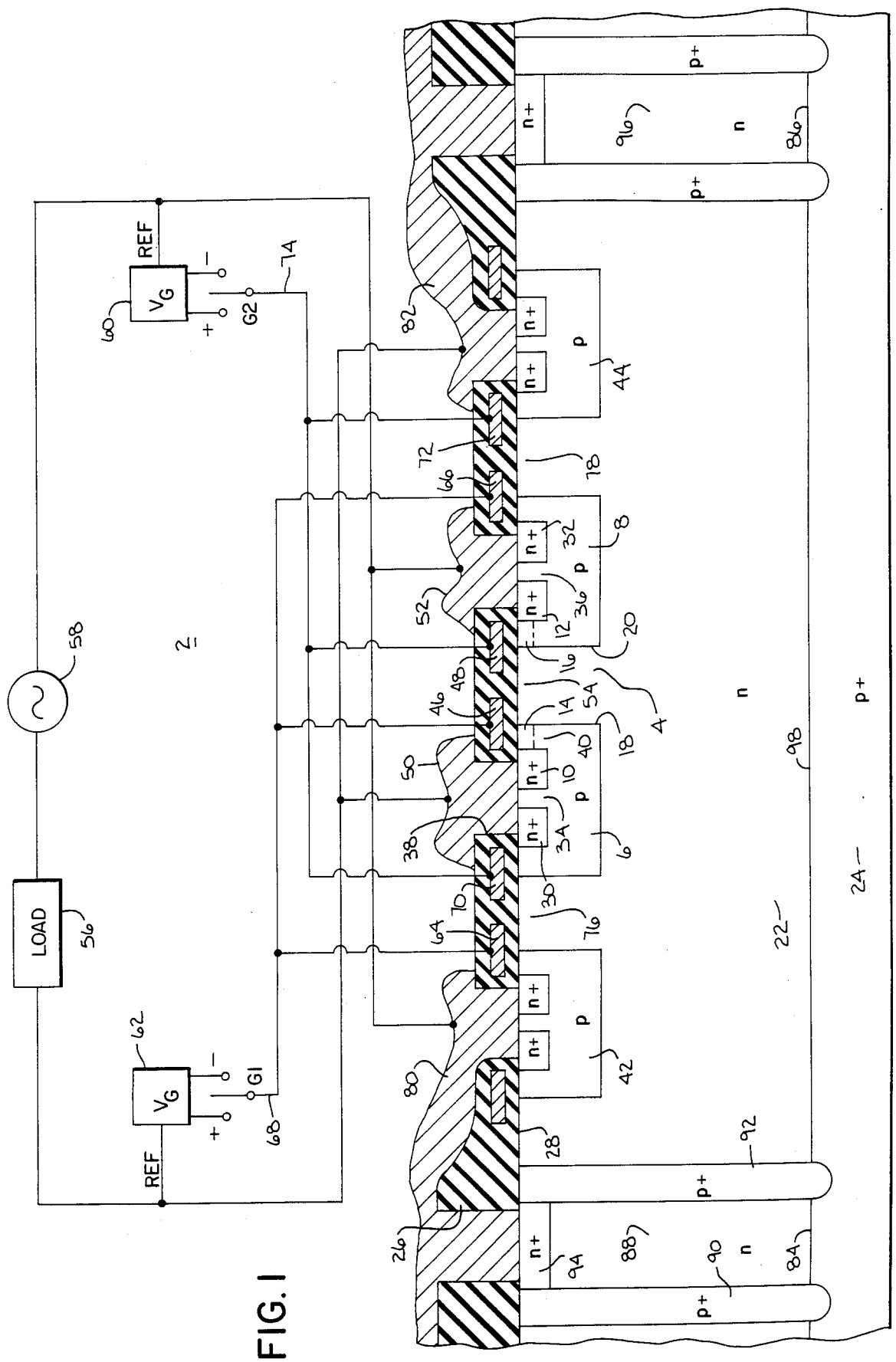
FIG. 1 is a schematic sectional view of bidirectional power FET structure constructed in accordance with the invention.

FIG. 1 shows bidirectional power FET 2 having a common drift region 4 between a pair of spaced first and second channel-containing regions 6 and 8 and first and second source regions 10 and 12. The first and second channels 14 and 16 are gated ON to invert the conductivity type thereof and afford conduction between said source regions 10 and 12 through drift region 4. In the OFF state, leftward current flow is blocked by junction 18, and rightward current flow is blocked by junction 20.

FET 2 includes a substrate or epitaxial layer 22 of semiconductor material of one conductivity type, such as n type, on top of a base layer 24 of opposite conductivity type, such as p type. Base layer 24 provides the field shaping region, to be described. A pair of p tub regions 6 and 8 are diffused or ion implanted into epitaxial layer 22 through holes in silicon dioxide insulating layer 26 on top major surface 28. N+ regions 10, 30 and 12, 32 are diffused or ion implanted into respective p regions 6 and 8 through the same holes in the oxide layer, in accordance with known double diffusion processing technology. N+ regions 10, 30 are prevented from forming in the central section 34 of p region 6 by a separate masking step, or in accordance with known SIPMOS processing technology, and likewise for central section 36 of p tub 8. Both the p and the n+ diffusions are performed through the same hole, and thus the oxide edge such as 38 provides aligned registry. The diffusion parameters control the lateral penetration of p edge 18 and n+ edge 40, which in turn control the lateral length of channel 14 therebetween, and likewise for channel 16. A multi-cell matrix array is formed by a plurality of other p tubs such as 42, 44 and so on, with their respective n+ regions, formed during the same processing steps as described.

Gate electrode means are provided having portions proximate the channels and adapted for application of electrical potential for producing electric fields of sufficient intensity to invert the conductivity type in the channels such that upon application of voltage of either polarity to the first and second source regions, electric current can flow in a respective corresponding direction between them, under control of the electrical potential of the gate electrode means. In one embodiment, as shown in copending Application Ser. No. 390,719, filed June 21, 1982, a single gate electrode may be spaced above the top major surface and extend laterally across both channels. In another embodiment, split gate electrode means is provided as shown in above noted copending Application Ser. No. 390,562, filed June 21, 1982. In FIG. 1, laterally spaced split gate electrodes 46 and 48 are deposited through an appropriate mask, followed by a top silicon dioxide insulating layer. Split gate electrodes 46 and 48 are insulated above and extend across respective channels 14 and 16. Main electrodes 50 and 52 are deposited in respective openings to ohmically contact respective source regions 10, 30 and 12, 32 and respective channel-containing regions 6 and 8.

Upon application of positive voltage to right gate electrode 48 with respect to right main electrode 52, electrons in p region 8 are attracted to top major surface 28 beneath gate 48 to thus invert the conductivity type in channel 16 to n type. Likewise upon application of positive voltage to left gate electrode 46 with respect to left main electrode 50, electrons in p region 6 are attracted to top major surface 28 beneath gate 46 to thus invert the conductivity type in channel 14 to n type. If left main electrode 50 is positive with respect to right main electrode 52, current may then flow from left main electrode 50, through left source region 10, through left channel 14, through drift region 4 along conduction path 54 beneath top major surface 28, then through right channel 16, through right source region 12, to right main electrode 52. The current is unipolar, i.e. consists only of majority carrier flow. The structure is bidirectional, and thus current may also flow from right main electrode 52 to left main electrode 50 when electrode 52 is positive with respect to electrode 50, and when the gates are turned on, i.e. made positive with respect to their respective main electrodes.

In a gating technique disclosed in copending Application Ser. No. 608,403, filed May 9, 1984, now abandoned, after initial field effect turn-on, one of the gates is turned OFF to provide bipolar conduction. For example, with FET 2 turned ON and current flowing from left main electrode 50 to right main electrode 52, left gate electrode 46 is turned OFF by making it negative with respect to left main electrode 50. Negative left gate electrode 46 attracts holes in p region 6 to thus revert channel 14 back to p type, thus rendering channel 14 nonconductive. Current instead flows across junction 18 by means of minority carrier injection of holes from p region 6 into drift region 4. This injection across forward biased junction 18 affords conductivity modulation through substrate 4 and bipolar action at reverse biased junction 20.

In an alternative gating operation, upon application of the positive voltage to right gate electrode 48 with respect to right main electrode 52, electrons in p region 8 are attracted to top major surface 28 to thus invert the conductivity in channel 16 to n type. If left main electrode 50 is positive with respect to right main electrode 52, current may then flow from p region 6 momentarily across forward biased PN junction 18 into drift region 4, then through right channel 16 to source 12 and to right main electrode 52. As soon as current starts to flow through the FET, the voltage across the main electrodes drops, which in turn reduces the potential in various regions of the FET, including the portion of p tub 6 below channel 14, which falling potential causes electrons to move toward top major surface 28 to thus invert channel 14 to n type and hence render channel 14 conductive. Forward biased PN junction 18 conducts only momentarily until the second channel 14 turns ON. The main current path through FET 2 is as before, from left main electrode 50, through left source 40, through left channel 14, through drift region 4 along portion 54, through right channel 16, through right source 12, to right main electrode 52. Reverse direction operation is comparable.

In the OFF state, current from left main electrode 50 to right main electrode 52 is blocked by reverse biased PN junction 20. Right gate electrode 48 is turned OFF so that channel 16 is p type. Current flow in the other direction from right main electrode 52 to left main electrode 50 is blocked by junction 18, with left gate electrode 46 being turned OFF such that channel 14 is p type.

Bidirectional FET 2 may be used to control AC power. FIG. 1 schematically shows a load 56 and a source of AC power 58 connected across main electrodes 50 and 52. During the first halfcycle of AC source 58, with left main electrode 50 positive with respect to right main electrode 52, switch G2 is in its leftward position such that gating potential source 60 biases right gate electrode 48 positively with respect to reference right main electrode 52. Channel 16 is thus inverted to n type. For fast turn-on, switch G1 is also in its leftward position such that left gate electrode 48 is biased positively with respect to left main electrode 50 by gating potential source 62. Channel 14 is thus inverted to n type and conduction occurs as above described.

Still during the first half cycle, after initial turn-on, G1 is switched to its rightward position such that left gate electrode 46 is made negative with respect to left main electrode 50. This reverts channel 14 back to p type and thus forces current across forward biased PN junction 18, causing the above noted minority carrier injection and bipolar conduction.

Before the end of the first halfcycle, G1 is switched back to its leftward position, making left gate electrode 46 positive with respect to left main electrode 50, and again inverting channel 14 to n type to thus short junction 18, and provide field effect conduction. This field effect conduction enables fast turn-off at the end of the first halfcycle.

Operation during the second halfcycle, with current flow leftwardly from right main electrode 52 to left main electrode 50, is comparable to that above described.

The structure of FET 2 may be a multi-cell matrix array incorporating a plurality of bidirectional power FETS integrated on a common substrate. For example, region 30 is part of the next FET cell to the left, and region 32 is part of the next FET cell to the right. Main electrode metallizations are provided and connected in series in the AC load line, or in parallel as shown in FIG. 1. Left gate electrodes 64, 66, and so on, are connected in parallel with left gate electrode 46 to left gate terminal 68. Right gate electrodes 70, 72, and so on, are connected in parallel with right gate electrode 48 to right gate terminal 74. In one of the halfcycles of AC source 58, main electrode 50 provides the source electrode for the FET to the left through drift region portion 76, and also provides the source electrode for the FET to the right through drift region portion 54, i.e. p tub pair 42 and 6 provide a FET cell to the left of main electrode 50, and p tub pair 6 and 8 provide a FET cell to the right of main electrode 50. Main electrode 52 provides the drain electrode for the FET through drift region portion 54, and also provides the drain electrode for the FET through drive region portion 78 provided by FET cell pair 8 and 44. In the other halfcycle of AC source 58, the roles of electrodes 50 and 52 are reversed, i.e. electrode 50 is the drain for its left and right FETs through respective drift region portions 76 and 54, and electrode 52 is the source for its left and right FETs through respective drift region portions 54 and 78. Alternate main electrodes 80, 52, and so on, are thus connected to one side of the AC source, and the other alternate main electrodes 50, 82, and so on, are connected to the other side of the AC source.

Region 24 provides field shaping to straighten out field lines in the drift region and prevent curvature crowding of field lines particularly in drift region portions 76, 54, 78, and so on. Crowding of field lines may cause potential gradient induced depletion and unwanted inversion of conductivity type along the noted drift region portions between the channel-containing regions, especially beneath top surface 28. This in turn reduces OFF state voltage blocking capability. Field shaping region 24 is referenced to substantially the same potential level as the main electrodes through steering diode means comprising first and second diode junction barriers 84 and 86 integrated in the substrate. Diodes 84 and 86 are connected between the main terminals in series opposition, with p region 24 interposed therebetween.

Diode junction 84 is formed by an n type isolation region 88 extending downwardly from top major surface 28 to bottom p layer 24. Isolation region 88 is part of epitaxial layer 22 but is isolated from drift region 4 and the channel-containing regions and the source regions by isolation moats 90 and 92 extending down from top major surface 28 through expitaxial layer 22 into the field shaping region 24.

Isolation moats 90 and 92 may be created by plasma etching, anisotropic etching, or isolation diffusion, as known in the art: C. Hu, "A Parametric Study of Power MOSFETs", IEEE Electron Device Conference, Paper CH1461-3/79, 0000-0385; IEEE Transactions Electron Devices, Volumn ED-25, No. 10, October, 1978; and Ammar and Rogers, "UMOS Transistors on Silicon", Transactions IEEE, ED-27, pages 907–914, May, 1980. Alternatively, the notches may be formed by a porous silicon region in accordance with the known anodization technique of passing a fixed current through the localized region in the presence of concentrated hydrogen fluoride to create a structural change in the silicon which remains single crystalline with the substrate but become porous. In the case of anisotropic etching, the notch may be filled with insulative material or with p+ material. In the case of anodization, the substrate may be subjected to an oxidizing atmosphere such that the oxygen enters the pores in the porous notched region and rapidly oxidizes these regions, which regions are still single crystalline with the substrate but substantially nonconductive. Alternatively, after the anodization, the notches may be etched quickly due to their porosity, and then filled with insulative material or p+ material. In a further alternative, an aluminum thermomigration process may be used: W. G. Pfann, Solid State Physics, No. 4,423,1957; T. R. Anthony and H. E. Cline, Journal of Applied Physics, No. 47, 2550, 1976. During the diffusion or ion implantation of the n+ source regions such as 10, a like region 94 may be formed in the isolation region 88. Isolation region 96 is comparable.

Means are provided for controlling the potential of field shaping region 24. Common main electrode metallization 80 ohmically contacts channelcontaining region 42 and its respective n+ source regions and also contacts isolation region 88 including region 94. Likewise, common main electrode metallization 82 ohmically contacts channel-containing region 44 and its respective n+ source regions and also contacts isolation region 96. Field shaping region 24 is thus referenced through diodes 84 and 86 to the most negative of the main electrodes 80, 52, or 82, 50.

In operation, during the OFF state, as the potential or main electrodes 52 and 80 rises, the potential in substrate drift region 4 increases across forward biased junction 20. The positive potential of substrate drift region 4 together with the negative potential of main electrodes 50 and 82 reverse biases reverse junction 18, and as this reverse bias increases, the drift region depletion spreads away from junction 18. Junction 98 between field shaping region 24 and drift region epitaxial layer 22 is likewise reverse biased due to the connection through diode 86 to the negative main electrodes 82, 50, i.e. drift region epitaxial layer 22 is positively biased across junction 20 from positive main electrode 52, and region 24 is negatively biased across junction 86 to main electrode 82. The depletion region around junction 98 thus spreads away therefrom upwardly into drift region epitaxial layer 22.

During the OFF state, with a rising potential on main electrode 52, and the consequent rising potential in drift region 4, portion 54 becomes more and more positive with respect to gate electrode 48. Relative negative gate electrode 48 may thus attract holes in drift region 4 towards top major surface 28 and cause unwanted inversion of region 54 to p type, i.e. potential gradient induced depletion of electrons out of top surface region 54. An induced p type region 54 would provide a conductive path between p tubs 8 and 6 and thus between main electrodes 50 and 52, which would be a short circuit failure in the OFF state.

As noted, the unwanted conductivity inversion in region 54 is caused by gradient induced depletion. The higher the gradient, the greater the curvature crowding of field lines in regions 76, 54, 78 and so on. Field shaping region 24, which is referenced to the most negative of the main electrodes, minimizes such potential gradient and consequent curvature crowding of field lines in drift region portions 76, 54, 78, particularly near top surface 28. The negative potential of layer 24 straightens or pulls the field lines out of drift region portions 76, 54, 78, and instead spreads such field lines laterally across epitaxial layer 22 so as to minimize the gradient in the drift region portions between the channel-containing regions. This increases the OFF state voltage blocking capability.

It is recognized that various modifications are possible within the scope of the appended claims.

We claim:

1. A planar, lateral, bidirectional power FET having a common drift region between a pair of spaced first and second channel-containing regions and first and second source regions, a field shaping region forming a junction with said drift region opposite the portion of said drift region between said channel-containing regions and extending symmetrically thereacross, and means for controlling the potential of said field shaping region such that during the OFF state of said FET said field shaping region straightens field lines and prevents gradient induced depletion and unwanted inversion of conductivity type along said drift region portion between said channel-containing regions,
   wherein:
   said first source region is of one conductivity type semiconductor material;
   said first channel-containing region is of opposite conductivity type semiconductor material and forms a junction wth said first source region;
   said drift region is of said one conductivity type semiconductor material and forms another junction with said first channel-containing region;
   said second channel-containing region is of said opposite conductivity type semiconductor material and forms a junction with said drift region;
   said second source region is of said one conductivity type semiconductor material and forms a junction with said second channel-containing region;
   said field shaping region is of said opposite conductivity type semiconductor material;
   and comprising gate electrode means including a first portion disposed proximate the first channel and a second portion disposed proximate the second channel, and adapted for application of electrical potential for producing electric fields of sufficient intensity to invert the conductivity type in said first and second channels;
   whereby upon application of voltage of either polarity to said first and second source regions, electric current can flow in a respective corresponding direction between them, under control of said electrical potential of said gate electrode means;
   and wherein said means for controlling the potential of said field shaping region comprises steering means for referencing said field shaping region to substantially the same potential as one of said source regions for one polarity voltage applied to said first and second source regions, and to substantially the same potential as the other of said source regions for the other polarity voltage applied to said first and second source regions.

2. The invention according to claim 1 wherein said gate electrode means comprises split gate electrode means comprising a first gate electrode disposed proximate said first channel and a separate second gate electrode disposed proximate said second channel.

3. The invention according to claim 1 comprising:
   first and second main electrodes each connected to a respective source region and channel-containing region;
   said FET having said OFF state in the absence of said electrical gate potential, with the junction between said drift region and said first channel-containing region blocking current flow from said second main electrode towards said first main electrode, and with the junction between said drift region and said second channel-containing region blocking current flow from said first main electrode towards said second main electrode.

4. The invention according to claim 3 wherein said means for controlling the potential of said field shaping region comprises means for referencing said field shaping region to substantially the same potential as said main electrodes.

5. A planar, lateral, bidirectional power FET having a common drift region between a pair of spaced first and second channel-containing regions and first and second source regions, a field shaping region forming a junction with said drift region opposite the portion of said drift region between said channel-containing regions and means for controlling the potential of said field shaping region such that during the OFF state of said FET said field shaping region straightens field lines and prevents gradient induced depletion and unwanted inversion of conductivity type along said drift region portion between said channel-containing regions, wherein:

said first source region is of one conductivity type semiconductor material;

said first channel-containing region is of opposite conductivity type semiconductor material and forms a junction with said first source region;

said drift region is of said one conductivity type semiconductor material and forms another junction with said first channel-containing region;

said second channel-containing region is of said opposite conductivity type semiconductor material and forms a junction with said drift region;

said second source region is of said one conductivity type semiconductor material and forms a junction with said second channel-containing region;

said field shaping region is of said opposite conductivity type semiconductor material;

and comprising gate electrode means including a first portion disposed proximate the first channel and a second portion disposed proximate the second channel, and adapted for application of electrical potential for producing electric fields of sufficient intensity to invert the conductivity type in said first and second channels;

whereby upon application of voltage of either polarity to said first and second source regions, electric current can flow in a respective corresponding direction between them, under control of said electrical potential of said gate electrode means;

and wherein said means for controlling the potential of said field shaping region comprises steering means for referencing said field shaping region to substantially the same potential as one of said source regions for one polarity voltage applied to said first and second source regions, and to substantially the same potential as the other of said source regions for the other polarity voltage applied to said first and second source regions, and comprising:

first and second main electrodes each connected to a respective source region and channel-containing region;

said FET having said OFF state in the absence of said electrical gate potential, with the junction between said drift region and said first channel-containing region blocking current flow from said second main electrode towards said first main electrode, and with the junction between said drift region and said second channel-containing region blocking current flow from said first main electrode towards said second main electrode, wherein said means for controlling the potential of said field shaping region comprises means for referencing said field shaping region to substantially the same potential as said main electrodes, wherein said last mentioned means comprises steering diode means comprising first diode means connected between said one main electrode and said field shaping region, and second diode means connected between said other main electrode and said field shaping region, said steering diode means being connected between said main electrodes in series opposition, with said field shaping region in series therebetween.

6. The invention according to claim 5 wherein said first and second diodes comprise integral first and second barrier junctions between said field shaping region and respective first and second isolation regions of said one conductivity type each isolated from said source regions, channel-containing regions and drift region by respective isolation moats extending down from a top major surface of said FET through said drift region into said field shaping region, and means connecting each said isolation region to a respective one of said main electrodes.

7. The invention according to claim 6 wherein said isolation moats are filled with semiconductor material of said opposite conductivity type.

8. The invention according to claim 6 wherein:

said channel-containing regions are laterally spaced by said drift region extending upwardly between said channel-containing regions to a top major surface of said FET;

said gate electrode means extend laterally along said top major surface and spaced thereabove by a layer of insulation, and said first and second portions extend across said first and second channels, respectively; and said field shaping region extends laterally beneath said drift region.

9. The invention according to claim 8 wherein said source regions are laterally spaced along said top major surface, and wherein said channels and said drift region are disposed between said source regions.

10. The invention according to claim 5 wherein:

said main electrodes are connected, to an AC load line;

said gate means is connected to gate potential source means;

such that said gate means is positive with respect to one of said main electrodes during the first halfcycle of said AC line, and is positive with respect to the other of said main electrodes during the second halfcycle of AC line;

such that during the first halfcycle of said AC line, current flow from said other main electrode through said second source region, through said second channel, through said drift region, through said first channel, through said first source region to said one main electrode; and such that during the second halfcycle of said AC line, current flow from said one main electrode through said first source region, through said first channel, through said drift region, through said second channel, through said second source region to said other main electrode.

11. The invention according to claim 10 wherein said gate means comprises split gate electrode means comprising a first gate electrode proximate said first channel and a second gate electrode proximate said second channel, said first and second gate electrodes being connectable to gate potential source means such that said first gate electrode is positive with respect to said one main electrode during the first halfcycle of said AC line, and said second gate electrode is positive with respect to said other main electrode during the second halfcycle of said AC line.

12. The invention according to claim 11 wherein said channels extend horizontally along a top major surface between a respective said source region and said drift region, and said first and second gate electrodes extend horizontally along said top major surface above respective said channels, said field shaping region extending horizontally beneath said drift region.

13. The invention according to claim 12 wherein said steering diode means reference said field shaping region to the most negative of said main electrodes.

14. A bidirectional lateral planar power FET, comprising:
an epitaxial layer of semiconductor material of one conductivity type providing a drift region on top of a base layer of opposite conductivity type providing a field shaping region;
a pair of channel-containing regions of said opposite conductivity type laterally spaced in said epitaxial layer along a top major surface of the latter;
a pair of source regions of said one conductivity type laterally spaced along said top major surface and each forming a junction with a respective one of said channel-containing regions;
a pair of main electrodes connected respectively to said source regions; and
gate electrode means including portions proximate the channels for attracting given polarity carriers to invert said channels to said one conductivity type in response to given gate potential, such that current may flow in either direction between said main electrodes;
said FET having an OFF state in the absence of said given gate potential, with the junction between said drift region and said one channel-containing region blocking current flow toward said one main electrode, and with the junction between said drift region and said other channel-containing region blocking current flow toward the other said main electrode;
a field shaping region of said opposite conductivity type forming a junction with said drift region opposite the portion of the latter between said channels and extending symmetrically thereacross such that in said OFF state depletion from the junction between said field shaping region and said drift region spreads toward said portion of said drift region between said channels to straighten field lines in said drift region away from said portion between said channels and prevent curvature crowding and gradient induced depletion in said last mentioned portion and hence prevent unwanted inversion to said other conductivity type along said drift region portion between said channels; and steering means for referencing said field shaping region to substantially the same potential as one of said source regions for one polarity voltage applied to said first and second source regions, and to substantially the same potential as the other of said source regions for the other polarity voltage applied to said first and second source regions,
such that in one polarity of said OFF state, depletion from said first channel region junction and from said field shaping region junction straighten field lines in said drift region and prevent curvature crowding,
and such that in the other polarity of said OFF state, depletion from said second channel region junction and from said field shaping region junction straighten field lines in said drift region and prevent curvature crowding.

15. The invention according to claim 14 wherein said channel-containing regions are spaced by said epitaxial layer drift region extending upwardly between said channel-containing regions to said top major surface.

16. The invention according to claim 15 wherein said source regions are laterally spaced along said top major surface with said channels and said epitaxial layer drift region therebetween.

17. A bidirectional lateral planar power FET, comprising:
an epitaxial layer of semiconductor material of one conductivity type providing a drift region on top of a base layer of opposite conductivity type providing a field shaping region;
a pair of channel-containing regions of said opposite conductivity type laterally spaced in said epitaxial layer along a top major surface of the latter;
a pair of source regions of said one conductivity type laterally spaced along said top major surface and each forming a junction with a respective one of said channel-containing regions;
a pair of main electrodes connected respectively to said source regions; and
gate electrode means including portions proximate the channels for attracting given polarity carriers to invert said channels to said one conductivity type in response to given gate potential, such that current may flow in either direction between said main electrodes;
said FET having an OFF state in the absence of said given gate potential, with the junction between said drift region and said one channel-containing region blocking current flow toward said one main electrode, and with the junction between said drift region and said other channel-containing region blocking current flow toward the other said main electrode; and
said field shaping region of said opposite conductivity type forming a junction with said drift region opposite the portion of the latter between said channels such that in said OFF state depletion from the junction between said field shaping region and said drift region spreads toward said portion of said drift region between said channels to straighten field lines in said drift region away from said portion between said channels and prevent curvature crowding and gradient induced depletion in said last mentioned portion and hence prevent unwanted inversion to said other conductivity type along said drift region portion between said channels, wherein each said main electrode is connected to its respective said source region and is also connected to its respective said channel-containing region, and comprising steering diode means connecting said field shaping region to respective said main electrodes to reference said field shaping region to the main electrode of greatest given polarity.

18. The invention according to claim 17 wherein said steering diode means comprises first and second diodes comprising integral barrier junctions between said field shaping region and respective first and second isolation regions of said one conductivity type comprising portions of said epitaxial layer isolated from said drift region and said channel-containing regions and said source regions by isolation moats extending downwardly from said top major surface into said field shaping region.

19. The invention according to claim 18 wherein:

said one main electrode comprises metallization ohmically contacting its respective said source region and channel-containing region and contacting said first isolation region of said one conductivity type;

said first isolation region extends vertically downwardly from said top major surface to said field shaping region to form said first steering diode junction therewith;

said other main electrode comprises metallization ohmically contacting its respective said source region and channel-containing region and contacting said second isolation region of said one conductivity type; and said second isolation region extends vertically downwardly from said top major surface to said field shaping region to form said second steering diode junction therewith.

* * * * *